United States Patent
Lopatin

(10) Patent No.: US 6,555,171 B1
(45) Date of Patent: Apr. 29, 2003

(54) CU/SN/PD ACTIVATION OF A BARRIER LAYER FOR ELECTROLESS CU DEPOSITION

(75) Inventor: Sergey D. Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/558,831

(22) Filed: Apr. 26, 2000

(51) Int. Cl.[7] .............................. B05D 3/10; B05D 5/12
(52) U.S. Cl. ....................... 427/305; 427/304; 427/98; 427/443.1; 438/678; 438/687
(58) Field of Search ..................... 427/304, 305, 427/98, 123, 437, 443.1; 438/678, 687

(56) References Cited

U.S. PATENT DOCUMENTS

| | | | |
|---|---|---|---|
| 3,011,920 A | * 12/1961 | Shipley, Jr. ................. | 117/213 |
| 5,169,680 A | 12/1992 | Ting et al. ................... | 427/96 |
| 5,674,787 A | 10/1997 | Zhao et al. .................. | 437/230 |
| 5,891,513 A | 4/1999 | Dubin et al. .................. | 427/98 |
| 6,059,940 A | * 5/2000 | Nogami et al. ........ | 204/192.15 |
| 6,136,693 A | * 10/2000 | Chan et al. .................. | 438/633 |
| 6,284,652 B1 | * 9/2001 | Charneski et al. .......... | 438/653 |
| 6,413,858 B1 | * 7/2002 | Chopra ........................ | 438/625 |
| 6,436,816 B1 | * 8/2002 | Lee et al. .................... | 438/643 |

OTHER PUBLICATIONS

Characterization of Electroless Cu, Co, Ni and their Alloys–For ULSI Metallization, Lopatin et al. Conference Proceedings ULSI XIII, 1998 Research Materials Society, pp. 437–443.

Selective and Blanket Electroless Copper Deposition for Ultralarge Scale Integration, Dubin et al., J. Electrochem. Soc., vol. 144, No. 3, Mar. 1997, 11 pages.

Electroless CoWP Barrier/ProtectionLayer Deposition For Cu Metallization,Lopatinet al., Mat. Res. Soc. Symp. Proc. vol. 451, 1997 Materials Research Society, pp. 463–469.

The Formation of Pd Seeded Copper Layer on Tin Substrates By Electroless Deposition, Min et al., Conference Proceedings ULSI XIV, 1999 Materials Research Society, pp.65–71.

High aspect ratio quarter–micron electroless copper integrated technology, Shacham–Diamandet al.,Microelectronic Engineering 37/38 (1997), pp. 77–88.

Electroless copper Metallisation of titanium nitride,Pattersonet al., Applied Surface Science91 (1995), pp. 124–128.

Copper interconnectionintegration and Reliability,Huet al, Thin Film Solids,262(1995), pp. 84–92.

* cited by examiner

*Primary Examiner*—Michael Barr

(57) ABSTRACT

Provided herein is a method of utilizing electroless copper deposition to form interconnects in a semiconductor device. An opening is formed in a dielectric layer in the form of a trench, via or combination thereof, and a diffusion barrier layer is blanket deposited in the opening. Then, a contact displacement technique is used to form a seed layer on the diffusion barrier layer which includes copper, tin and palladium. Electroless deposition of copper is been undertaken to autocatalytically deposit copper on the activated barrier layer. The process continues to create a conformal, void free electroless copper deposition.

11 Claims, 3 Drawing Sheets

CU/SN/PD ACTIVATION OF A BARRIER LAYER FOR ELECTROLESS CU DEPOSITION

BACKGROUND OF THE INVENTION

1. Field of the Invention

This subject matter relates generally to semiconductor devices and techniques for their manufacture, and more particularly, to semiconductor devices and manufacturing techniques which include electrolessly deposited metallization.

2. Discussion of the Related Art

Typically, in the manufacture of high density semiconductor devices, multiple layers of conductive material connected by vias or plugs are provided above a substrate. Such multiple layers, typically of metal, are employed in order to accommodate high device densities.

Recently, copper has received significant attention for use as via material in VLSI (very large-scale integration) and ULSI (ultra large-scale integration) applications. In particular, electroless copper deposition has been indicated as a desirable process applicable to 100 nm-damascene metallization because of its high conformality, low deposition temperature, high via/trench filling capability and low processing cost. However, electroless deposition of copper requires the activation of a surface on which the electroless deposition takes place. Furthermore, since copper conductors require isolation from adjacent material, the electroless deposition of copper must generally be performed on a barrier layer, i.e., the activation process must be performed on the barrier layer. An example of such a process is shown and described in U.S. Pat. No. 5,891,513, entitled "Electroless CU Deposition On a Barrier Layer by CU Contact Displacement for ULSI Applications", Valery M. Dubin et al., issued Apr. 6, 1999.

The above-cited patent discloses a process wherein a surface of a barrier layer is activated for electroless deposition of copper by bringing the barrier layer surface into contact with an aqueous copper contact displacement solution. Such contact forms a seed layer of copper on the barrier layer surface. Copper is then electrolessly deposited on the activated surface. In that patent, the seed layer includes only the same metal as that which is electrolessly deposited, i.e., in that situation copper. The inclusion of other metals in the seed layer (such as tin or palladium) is purposely avoided.

A significant problem faced with metal conductors is that of electromigration. With current flow through a metal conductor, over time, the atoms of the metal may migrate to cause a break in the metal. Although copper is relatively resistant to such electromigration, as device dimensions continue to decrease, it will be understood that an increase in a metal's ability to withstand such electromigration is highly desirable. Ideally, this increased resistance to electromigration should be obtainable in the environment of electrolessly deposited copper described above.

Therefore, what is needed is a process which provides proper activation of a barrier layer for subsequent electroless deposition of copper thereon, meanwhile providing that the electrolessly deposited copper is highly resistant to electromigration.

SUMMARY OF THE INVENTION

In the present method, a surface of a diffusion barrier layer has a seed layer formed thereon for electroless deposition of copper. The seed layer is formed by subjecting the surface of the diffusion barrier layer to an aqueous contact solution which includes copper, tin and palladium, and hydrochloric and hydrofluoric acids. The hydrofluoric acid serves to remove native oxide from the diffusion barrier layer prior to formation of such seed layer. The proportions of copper, tin and palladium compounds in the solution are chosen so that the seed layer formed during this process promotes electroless deposition of copper thereon, meanwhile with the tin and palladium in the seed layer causing the free migrated copper at the copper surface to be reduced, due to tin and palladium binding with the copper. Preferably, the seed layer contains copper, tin and palladium substantially in the following atomic % percent ratios:

Cu:Sn:Pd: 12:1:0.01.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventor for practicing the invention.

Figure 1:
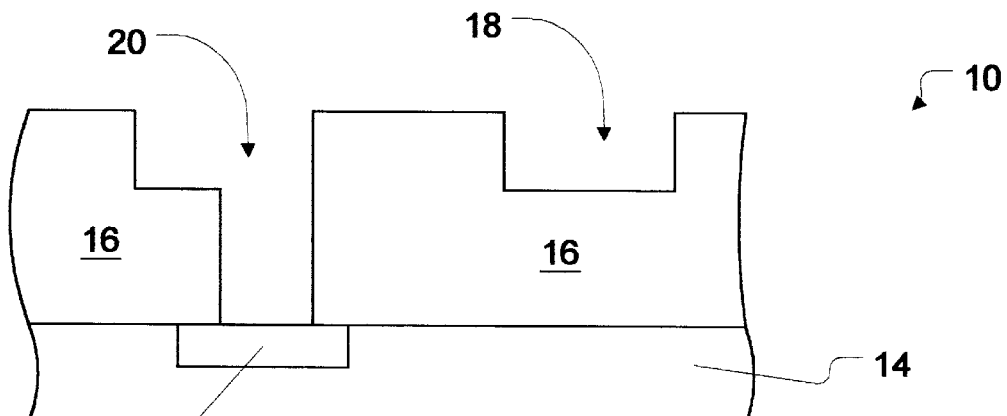
FIG. 1 is a cross-sectional view of a semiconductor device showing a metal layer overlaid with a dielectric layer in which a via opening and trench openings are formed.

As shown in FIG. 1, a semiconductor structure IO has a metal layer 12 provided on a first dielectric layer 14, the resulting structure being covered by a second dielectric layer 16. The metal layer 12 may be one of the metal layers in a multiple metal level semiconductor device.

By the use of known processes, an opening 18 in the form of a trench is formed in the dielectric layer 16 as shown. Additionally, another opening 20 in the form of a trench/via combination is formed in the dielectric layer 16, the opening 20 extending through the dielectric layer 16 to the metal layer 12. The trench/via opening 20 will eventually be filled with a conductive material to form a plug interconnect between the metal layer 12 and an overlying metal layer. Likewise, the trench 18 will eventually be filled with a conductive material. It will be appreciated that the structure of FIG. 1 may be fabricated using a variety of known processes.

Figure 2:
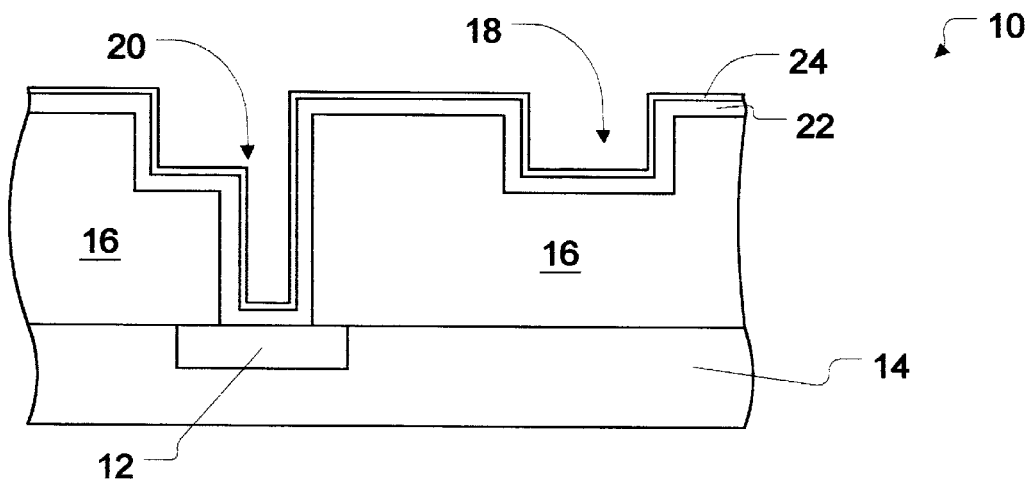
FIG. 2 is a cross-sectional view of the semiconductor device of FIG. 1 in which a barrier layer is deposited over the dielectric layer and in the via and trench openings.

Referring to FIGS. 2–6, a method of the present invention for forming a copper conductors by a technique of contact displacement to initiate an autocatalytic reaction of copper is described. In FIG. 2, a tantalum diffusion barrier layer 22 is blanket deposited over the structure, the diffusion barrier layer 22 being conformally deposited by a known technique such as physical vapor deposition (PVD), to a thickness in the range 30–300 angstroms. The barrier layer may also be WN, TiN, TaSiN, or TiSiN, any of which may be deposited by chemical vapor deposition. Typically, the tantalum or other material diffusion barrier layer will form thereon a native oxide layer 24 (in the case of tantalum, $Ta_2O_5$) 24 due to its exposure to the air. This native oxide layer 24 must be removed from the diffusion barrier layer 22 prior to any surface activation of the diffusion barrier layer 22, as the presence of such native oxide layer 24 will strongly inhibit such activation. This native oxide layer 24 will indeed be removed prior to surface activation of the diffusion barrier layer 22, as will now be described, Reference is made to FIG. 3 for illustration of the technique of the present invention for activating the surface of the diffusion barrier layer 22 for electroless deposition of copper thereon. As is noted above, activation of a metal is necessary in order to pursue the autocatalytic reaction for the electroless deposition of copper on that metal. The present invention uses copper, tin and palladium in a solution to form a seed layer on the diffusion barrier layer by contact displacement. In the practice of the invention, the structure of FIG. 2 is subjected to an aqueous contact solution containing the following materials in the following amounts:

| | |
|---|---|
| CuSO4 | 1–50 grams/liter |
| SnCl2 | 1–30 grams/liter |
| PdCl2 | 0.02–5 ml./liter |
| HCl | 0.5–7 ml./liter |
| HF (49%) | 150–400 ml./liter |

Upon initial contact of the solution with the diffusion barrier layer, the hydrofluoric acid etches away the native oxide layer $Ta_2O_5$ on the diffusion barrier layer 22, exposing the surface of the diffusion barrier layer 22. The activation process can then readily proceed.

The conditions for activating the surface of the diffusion barrier layer 22 are as follows:

| | |
|---|---|
| Temperature | 18–25 degrees C. |
| pH | 1–3 |
| Time | 3–60 seconds |

Through this process, a continuous seed layer 26 is formed on the diffusion barrier layer 22 by contact displacement, which seed layer 26 contains copper, tin and palladium. The seed layer 26 is formed to be in the range of 30–70 angstroms thick, and contains copper, tin and palladium substantially in the following atomic % ratios:

| | |
|---|---|
| Cu:Sn:Pd | (range 8–30):(range 0.5–4):(range 0.005–0.02) |

Preferably, the seed layer 26 contains copper, tin and palladium substantially in the following atomic % ratios:
Cu:Sn:Pd 12:1:0.01

The surface of the diffusion barrier layer is now prepared for deposition of autocatalytic electrolessly deposited copper. A rinsing operation is undertaken in $H_2O$ or $H_2O$+a reducing agent, with an $N_2$ purge. Then, the copper electroless deposition process is undertaken, for 30 seconds–2 minutes.

The theory of electroless deposition on a conductive barrier layer is based on the mechanism of two different simultaneous electrochemical reactions: reduction of the metal ions $M^{n+}$ (cathodic reaction) and oxidation of reducing agent Red (anodic reaction). The partial electrode reactions in the system are:

1. Reduction of metal ions

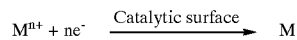
$$M^{n+} + ne^- \xrightarrow{\text{Catalytic surface}} M$$

2. Oxidation of reducing agent

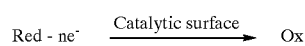
$$Red - ne^- \xrightarrow{\text{Catalytic surface}} Ox$$

Then, a rinsing operation is undertaken for 0.5–2 minutes in $H_2O$, followed by drying in $N_2$ flow for 20 seconds–1 minute.

Figure 4:
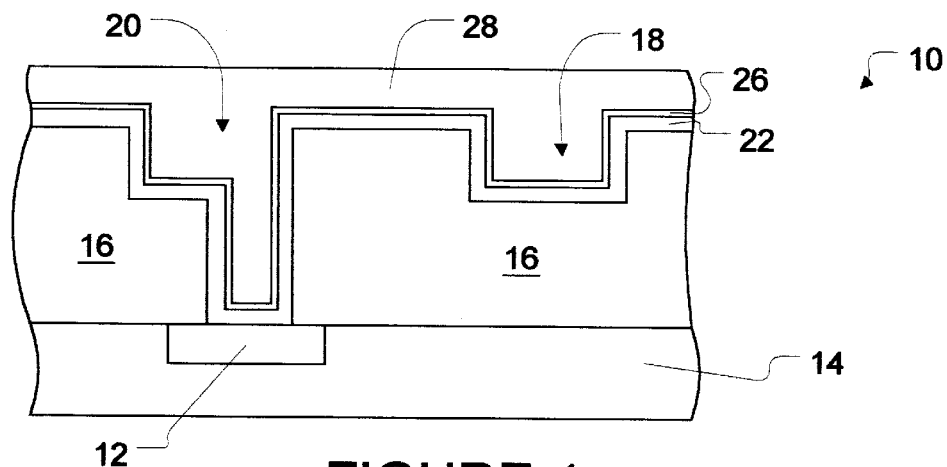
FIG. 4 is a cross-sectional view of the semiconductor device of FIG. 3 wherein copper has been electrolessly deposited on the activated barrier layer to fill the trench and trench/via.

FIG. 4 shows copper 28 deposited by the technique of electroless copper deposition. A blanket growth of electrolessly deposited copper 28 forms above the diffusion barrier layer 22, filling the trench and trench/via openings 18, 20, and extending thereabove.

Figure 5:
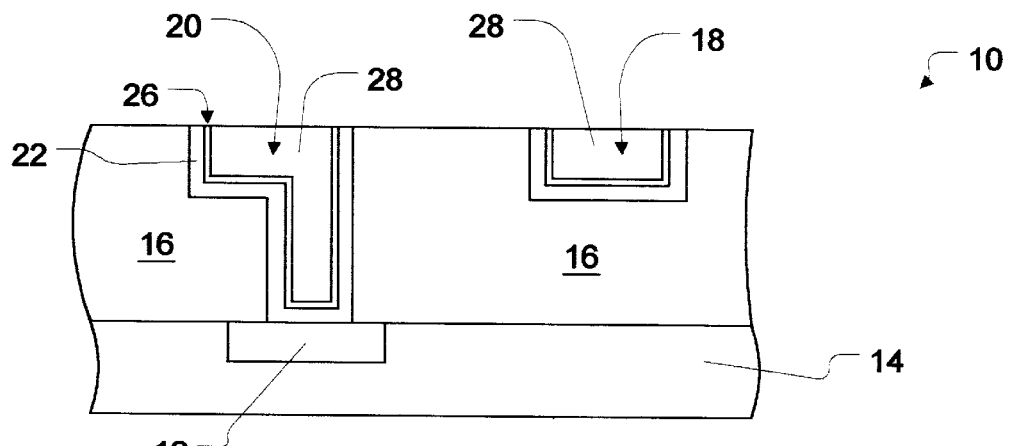
FIG. 5 is a cross-sectional view of the semiconductor device of FIG. 4 in which the excess copper above the dielectric layer has been removed.

As shown in FIG. 5, the excess copper and excess barrier layer are removed so that the remaining copper 28 fills in the trench and trench/via opening 18, 20. Such excess copper and excess barrier layer can be removed by etching or polishing as is well known.

Figure 6:
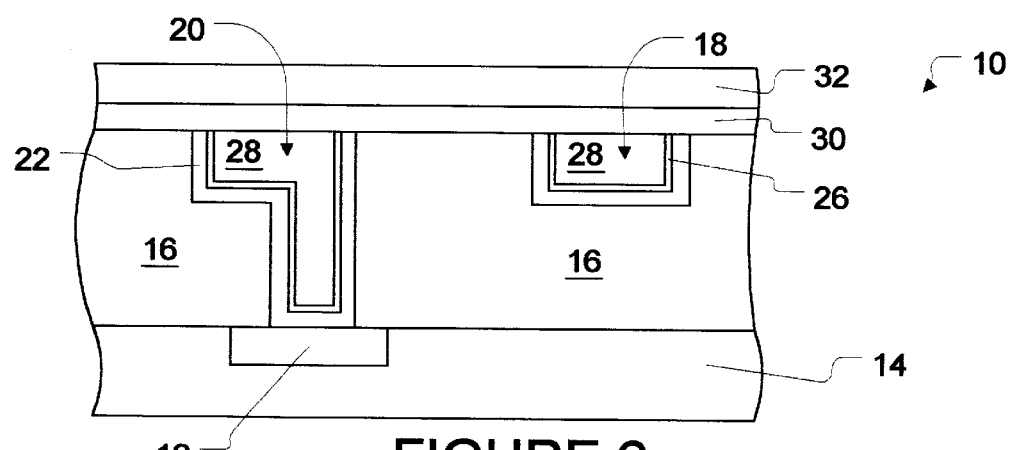
FIG. 6 is a cross-sectional view of the semiconductor device of FIG. 5 showing an overlying dielectric layer formed above the structure of FIG. 5.

Then, as shown in FIG. 6, a layer of silicon nitride 30 is formed thereover by chemical vapor deposition (CVD), and a dielectric layer 32 is formed over the resulting structure.

It will be readily understood that additional processing steps can be undertaken in furtherance of the fabrication of a complete semiconductor device.

Figure 3:
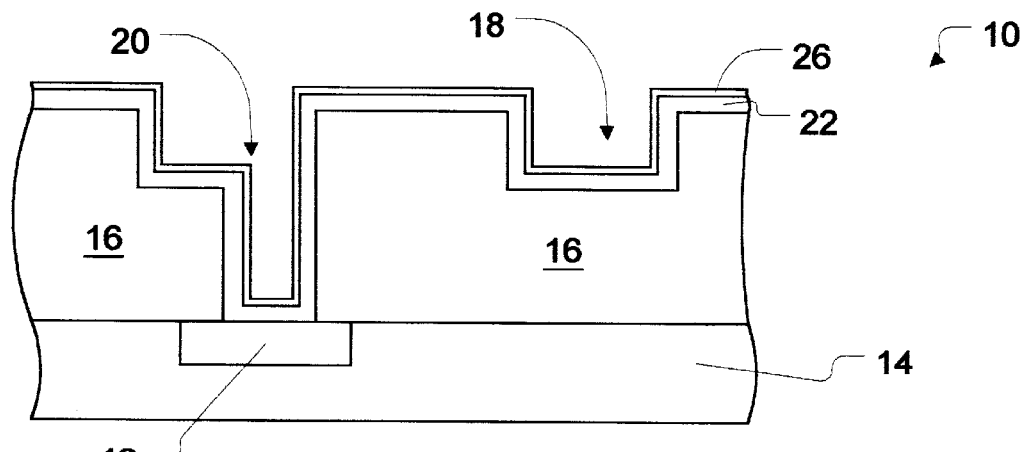
FIG. 3 is a cross-sectional view of the semiconductor device of FIG. 2 showing activation of the barrier layer by formation of a seed layer thereon.
Figure 7:
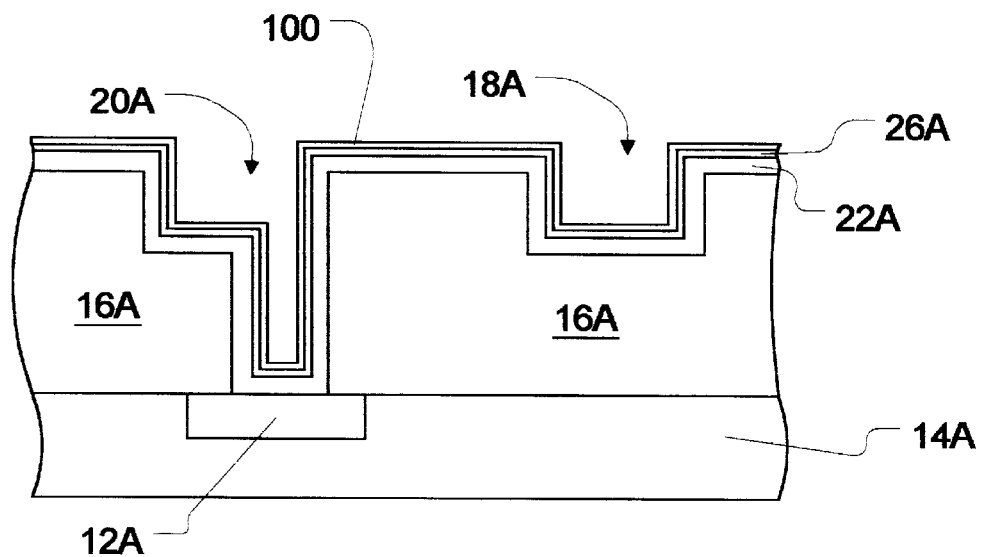
FIG. 7 is a cross-sectional view of the semiconductor device of FIG. 3 wherein a conformal layer of copper has been electrolessly deposited.
Figure 8:
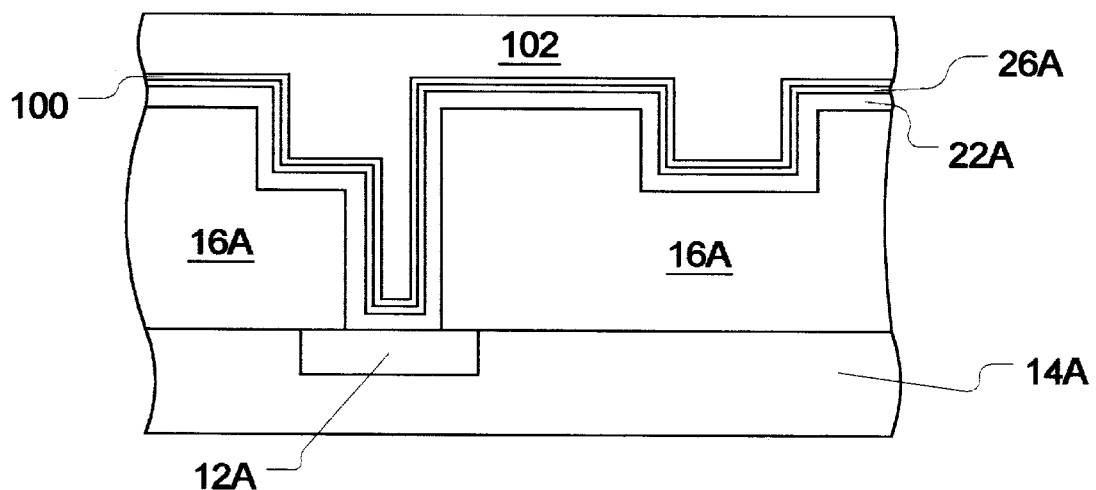
FIG. 8 is a cross-sectional view of the semiconductor device of FIG. 7 wherein copper has been applied by electroplating to fill the trench and trench/via.

As an alternative, and with reference to FIGS. 7 and 8, with the structure in place as shown in FIG. 3, instead of the electrolessly deposited copper filling the trench and trench/via openings as shown and described above, a conformal layer 100 of copper is electrolessly deposited, on the order of 10–50 nm thick (FIG. 7). Then, copper 102 is applied on the electrolessly deposited layer 100 by means of electroplating to fill the trench and trench/via openings 18A, 20A, and extend there beyond As shown in FIG. 8, the excess copper and excess barrier layer can be removed by etching or polishing as is well known. Thereafter, additional processing steps are undertaken as set forth above in furtherance of the fabrication of a complete semiconductor device.

High catalytic activity in the electroless copper deposition process has been achieved with the copper/in/palladium seed layer 26. The copper film, while initially discontinuous, becomes continuous upon sufficient deposition time to form a continuous, void free copper conductor.

The inclusion of tin in a relatively small amount in the seed layer 26 greatly improves the copper conductor's resistance to electromigration referred to above. With the grain boundary of the electrolessly deposited copper packed with tin atoms, diffusion of copper is greatly limited in the direction of electric flow along the interface of the deposited copper and the diffusion barrier layer.

The inclusion of palladium in a very small amount in the seed layer further increases the copper conductor's resistance to electromigration. The inclusion of such a small amount of palladium has been found not to reduce the stability of electroless copper deposition solution or to increase the resistivity of the electroless copper deposition.

Accordingly, a technique is described in which the advantages associated with electroless deposition of copper for conductive parts in a semiconductor device are present. The activation of a barrier metal layer is achieved by use of a contact solution which forms a seed layer which readily promotes subsequent autocatalytic deposition of copper. Through use of this process, a copper conductor of high conformality and high trench and via filling capability is achieved, at low processing cost. These advantages clearly promote the use of this process in very small dimension devices, meanwhile greatly improving the resistance to electromigration characteristics of the copper.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of preparing a surface of a diffusion barrier layer for electroless deposition of copper thereon, comprising:

subjecting the diffusion barrier layer to a contact displacement solution comprising copper, tin and palladium; and forming a seed layer comprising copper, tin and palladium on the diffusion barrier layer by contact displacement.

2. A method of preparing a surface of a diffusion barrier layer for electroless deposition of copper thereon, comprising:

subjecting the diffusion barrier layer to a contact displacement solution comprising copper and palladium; and forming a seed layer comprising copper and palladium on the diffusion barrier layer by contact displacement.

3. A method of preparing a surface of a diffusion barrier layer for electroless deposition of copper thereon, comprising:

subjecting the diffusion barrier layer to a contact solution comprising copper and tin; and forming a seed layer comprising copper and tin on the barrier layer surface by contact displacement.

4. The method of claim 1 and further comprising the step of providing the seed layer as 30–70 angstroms thick.

5. The method of claim 1 and further comprising the step of providing that the solution further comprises hydrofluoric acid (BF).

6. The method of claim 5 and further comprising the step of providing that the solution further comprises hydrochloric acid (HCl).

7. The method of claim 5 and further comprising the step of subjecting the diffusion barrier layer to the solution at 18–25 degrees C. for 3–60 seconds.

8. The method of claim 1 and further comprising the step of providing that the diffusion barrier layer comprises tantalum.

9. The method of claim 8 and further comprising the step of providing that the diffusion barrier layer is 30–300 angstroms thick.

10. The method of claim 1 and further comprising the step of forming the seed layer as a continuous layer having copper, tin and palladium in the following atomic % ratios:

Cu:Sn:Pd (range 8–30):(range 0.5–4):(range 0.005–0.02).

11. The method of claim 10 and further comprising the step of forming the seed layer as a continuous layer having copper, tin and palladium substantially in the following atomic % ratios:

Cu:Sn:Pd 12:1:0.01.

* * * * *